(12) United States Patent
Pascucci et al.

(10) Patent No.: US 7,525,851 B2
(45) Date of Patent: Apr. 28, 2009

(54) ROW DECODER CIRCUIT AND RELATED SYSTEM AND METHOD

(76) Inventors: Luigi Pascucci, Via Ferrara, 26, I-20099 Sesto S. Giovanni (MI) (IT); Paolo Rolandi, Via G. Parin, 1, I-27058 Voghera (MI) (IT)

(*) Notice: Subject to any disclaimer, the term of this patent is extended or adjusted under 35 U.S.C. 154(b) by 41 days.

(21) Appl. No.: 11/434,564

(22) Filed: May 15, 2006

(65) Prior Publication Data
US 2006/0268650 A1 Nov. 30, 2006

(30) Foreign Application Priority Data
May 13, 2005 (IT) ................... MI2005A0868

(51) Int. Cl.
*G11C 5/14* (2006.01)

(52) U.S. Cl. .............................. 365/189.09; 365/230.05; 365/189.04; 365/218; 365/230.06

(58) Field of Classification Search ............ 365/230.06, 365/230.05, 189.04, 218, 189.09
See application file for complete search history.

(56) References Cited

U.S. PATENT DOCUMENTS

| | | | | |
|---|---|---|---|---|
| 5,392,253 | A * | 2/1995 | Atsumi et al. .......... | 365/230.06 |
| 5,886,566 | A * | 3/1999 | Park et al. .................. | 327/536 |
| 2002/0057639 | A1 * | 5/2002 | Shiizaki et al. .......... | 369/53.35 |
| 2002/0176312 | A1 * | 11/2002 | Lee et al. ............... | 365/230.06 |
| 2003/0198101 | A1 * | 10/2003 | Pio .......................... | 365/200 |
| 2004/0027878 | A1 * | 2/2004 | Kim et al. .................. | 365/200 |
| 2004/0076037 | A1 * | 4/2004 | Bedarida et al. ....... | 365/185.13 |

* cited by examiner

*Primary Examiner*—Thong Q Le
(74) *Attorney, Agent, or Firm*—Trop, Pruner & Hu, P.C.

(57) ABSTRACT

A row decoder circuit is described of the type comprising at least one input stage connected to a first supply voltage reference and to an output stage connected to a second supply voltage reference, the output stage having at least one output terminal connected to a word line of a memory matrix. The row decoder circuit further comprises a biasing device, connected to a third supply voltage reference and comprising at least one generator of a negative voltage connected to a divider, in turn connected to a first biasing terminal of the biasing device. In particular, the first biasing terminal is connected to at least one input stage in correspondence with bulk terminals of MOS transistors comprised in the input stage and it is suitable for supplying it with a first negative voltage.

54 Claims, 6 Drawing Sheets

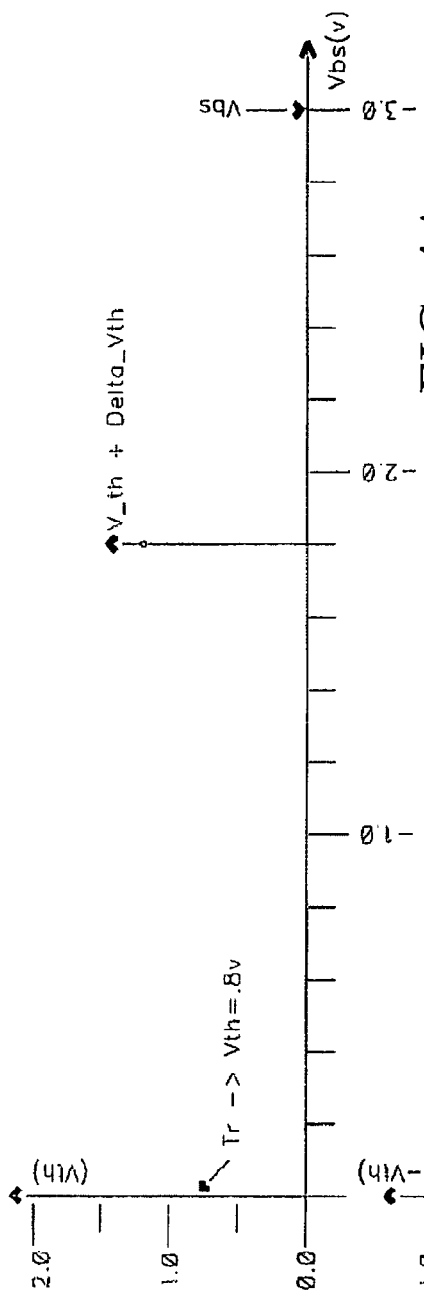
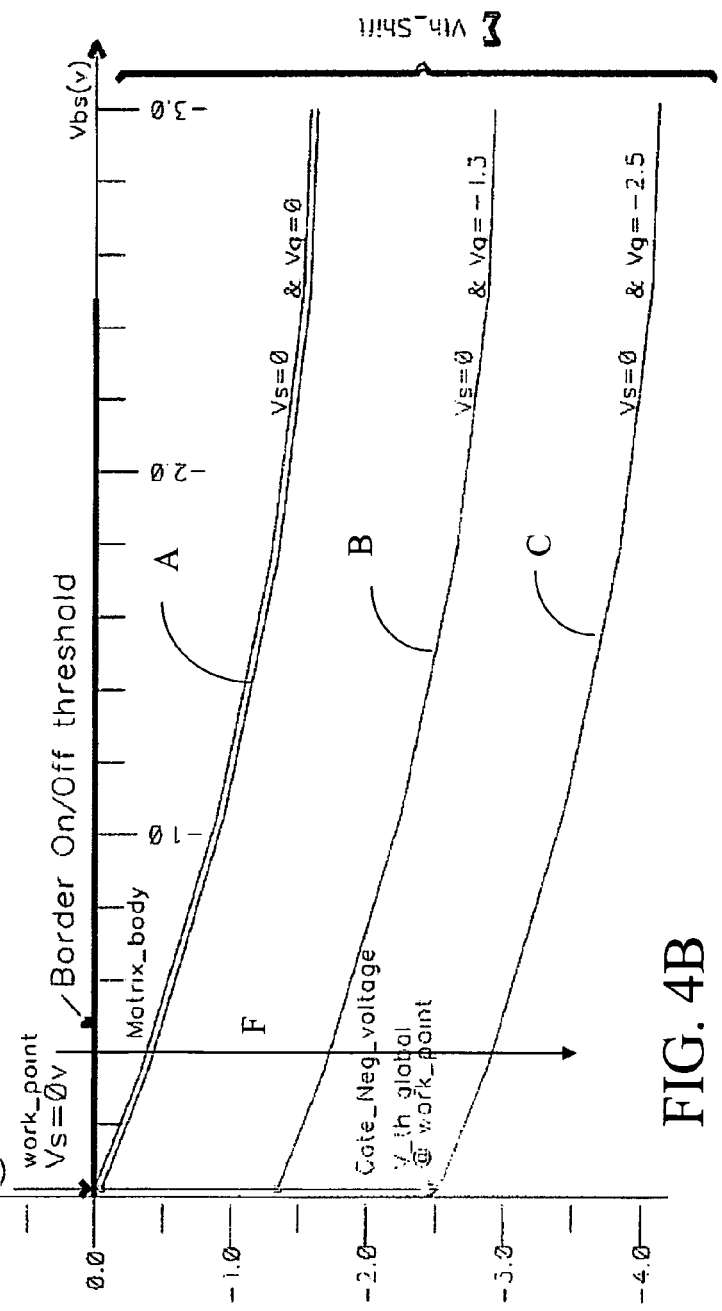
FIG. 4A
FIG. 4B

US 7,525,851 B2

ROW DECODER CIRCUIT AND RELATED SYSTEM AND METHOD

PRIORITY CLAIM

This application claims priority from Italian patent application No. MI2005A 000868, filed May 13, 2005, which is incorporated herein by reference.

TECHNICAL FIELD

The present invention generally relates to a row decoder circuit.

More specifically, an embodiment of the invention relates to a row decoder circuit of the type comprising at least one input stage connected to a first supply voltage reference and one output stage connected to a second supply voltage reference, said output stage having at least one output stage connected to a word line of a memory matrix.

Another embodiment of the invention also relates to a method for selectively applying a high negative voltage to a word line of a memory matrix, by means of a row decoder circuit.

Yet another embodiment of the invention particularly, but not exclusively, relates to a row decoder circuit for flash memories and the following description is made with reference to this field of application by way of illustration only.

BACKGROUND

As it is well known, one of the most delicate and complex operations in the functioning of flash memories is the electric erase of the same.

This erase operation comprises, in reality, more steps which, according to the technology and to the manufacturer of the flash memory, can be slightly different both in type and in number.

The selective verify steps of the flash memory cells are particularly problematic, such as the verify step of the deplete state, the so called depletion verify. This depletion verify step in fact requires, at least in some technologies, that high negative voltage values are applied to the gate terminals only of some cells of the memory, in particular, the cells which are deselected with respect to this depletion verify step. Only in this way it is possible to avoid leakage due to the undesired conduction by cells which, due to a higher erase speed, reach a negative threshold state, i.e., a deep depletion state at the end of an erase pulse, which, as it is known, interests a whole sector of a flash memory.

In other words, the application of the erase pulse to a sector of the flash memory, calibrated so as to ensure the erase of all the memory cells of the sector and thus regulated for the "harder" cells to be erased (cells with low erase speed) causes the switching, into a deep depletion state, of the "easier" cells to be erased (cells with high erase speed).

The depletion verify step thus needs a voltage with high negative value for carrying out a correct verification also of the cells having high erase speed.

From a circuit point of view, this implies the introduction, into a row decoder circuit, of suitable circuitry able to generate the high negative voltage required.

It is to be noted that this circuitry generating the high negative voltage inside the row decoder circuit is not necessary for the correct execution of the real erase step. In fact, in the erase step, a negative voltage value (normally equal to about −8V) is applied to the gate terminals of all the cells of a sector: the erase step of a flash memory is thus an operation which is non selective, but interests all the cells of a memory sector.

It is known to realize this circuitry generating the high negative voltage by introducing, into the row decoder circuit, suitable level shifters. These level shifters, even if realized in a distributed way, i.e., in such a way as to be shared by more rows of the memory matrix, often must however be integrated in the pitch of the cells and they thus increase the area occupation thereof. In the known solutions, these level shifters substantially double the area occupation of the row decoder circuit.

Row decoder circuits with very compact layout and able to apply a strongly negative voltage to all the cells of a memory sector are also known.

Such a circuit is schematically shown in FIG. 1, globally indicated with 1.

The row decoder circuit 1 comprises an input stage 2 connected to an output stage, in particular a row driver 3, in turn connected to a control or gate terminal G4 of the memory cells 4. The row decoder circuit 1 also comprises a decoupling stage 5, inserted between the input stage 2 and the row driver 3, as well as a biasing block 6, connected to the row driver 3.

More in particular, the input stage 2 is inserted between a first and a second supply voltage reference, in particular, a supply voltage Vdd and a ground GND and it has a first input terminal I21 connected to an address buffer Add, as well as a second input terminal I22 receiving a clock signal, Ck. The input stage 2 comprises a first transistor M1, a second transistor M2 and a third transistor M3, as well as selection transistors Mn (in the example, for sake of simplicity, only one has been shown) inserted, in series to each other, between the supply reference Vdd and the ground GND.

In the example shown in FIG. 1, the first transistor M1 is a PMOS transistor inserted between the supply voltage reference Vdd and an output terminal O2 of the input stage 2 and having a gate terminal connected to the gate terminal of the third transistor M3 and to the second input terminal I22 of the input stage 2. This third transistor M3 is of the NMOS type and it is inserted between the selection transistors Mn and the ground GND.

The second transistor M2 and the selection transistor Mn are transistors of the NMOS type, inserted between the output terminal O2 and the third transistor M3 and they have gate terminals connected to the first input terminal I21 of the input stage 2.

The signals applied to the input stage 2 can vary between the ground GND (0V) and the supply voltage Vdd, generally equal to 3V, as indicated on the bus Add.

The row driver 3 comprises a first transistor M4 and a second transistor M5 inserted, in series to each other, between a third supply voltage reference, in particular a regulation voltage Vreg, and a biasing node XB. The first transistor M4 and second transistor M5 have gate terminals connected to each other and to an input terminal I3 of the row driver 3, and they are interconnected in correspondence with an output terminal O3 of this row driver 3, in turn connected to a word line wl, i.e., a gate terminal G4 of the memory cells 4.

In particular, in the example shown in FIG. 1, the first transistor M4 is a PMOS transistor and the second transistor M5 is a NMOS transistor, interconnected in the form of a CMOS buffer.

The biasing node XB is also connected to the biasing block 6, in turn comprising a negative voltage generator G6 connected to this biasing node XB by means of a switch SW6. The switch SW6 is connected, in a fixed way, to the biasing node XB and, in an alternated or switched way, between the ground and the negative voltage generator G6. In substance, the switch SW6 allows to substitute the ground GND with the voltage supplied by the generator G6 for biasing the second transistor M5 of the row driver 3.

It is suitable to note that the signals applied to the row driver 3 can vary between the ground GND (0V) and a programming voltage value Vpcx, distinct from the supply voltage. Vdd and generally equal to 9V, as indicated in correspondence with the input terminal I3 of the row driver 3.

The decoupling stage 5 comprises a first transistor M6, inserted between the output terminal O2 of the input stage 2 and the input terminal I3 of the row driver 3 and having a gate terminal biased by means of a suitable signal P, as well as a second transistor M7, inserted between the regulation voltage reference Vreg and the input terminal I3 of the row driver 3 and having a gate terminal suitably driven by means of a signal Pull.

Also the signals applied to the decoupling stage 5 can vary between the ground GND (0V) and the programming voltage Vpcx (generally equal to 9V), as schematically indicated in correspondence with the first transistor M6.

The bulk terminals of the second transistor M2 and of the third transistor M3 of the input stage 2 as well as of the first transistor M6 of the decoupling stage 5 are connected to the ground GND.

The row decoder circuit 1 is used for applying a strongly negative voltage to the word lines of a memory sector during the erase step.

Unfortunately, the row decoder circuit 1 is not suitable for the application of sufficiently negative voltages in a selective way, for example to the word lines which are deselected during the depletion verify step, voltages which take into account the process variations due to the cells in the deep depletion state.

Also the row decoder circuit 1 shown in FIG. 1 must thus be integrated with suitable level shifters for correctly conducting the depletion verify step also on cells in a deep depletion state, with the consequent problems relative to the increase of the area occupation.

SUMMARY

An embodiment of the present invention provides a method and a relative row decoder circuit able to correctly carry out a depletion verify step also on cells in deep depletion state without substantially increasing the area occupation of the row decoder circuit and overcoming limits and drawbacks still affecting the circuits realized according to the prior art.

Another embodiment of this invention exploits the so called bulk effect to suitably vary the threshold voltage values of the transistors in the row decoder circuit, allowing the selective application of a high negative voltage to a memory cell and ensuring, in the meantime, the necessary interdiction of the cells belonging to non selected word lines.

BRIEF DESCRIPTION OF THE DRAWINGS

Characteristics and advantages of the row decoder circuit and of the method according to an embodiment of the invention will be apparent from the following description of an embodiment thereof given by way of indicative and non limiting example with reference to the annexed drawings.

FIGS. 4A and 4B are qualitative plots of the variations of parameters inside the circuit of FIG. 2 by applying a method according to an embodiment of the invention.

DETAILED DESCRIPTION

Figure 1:
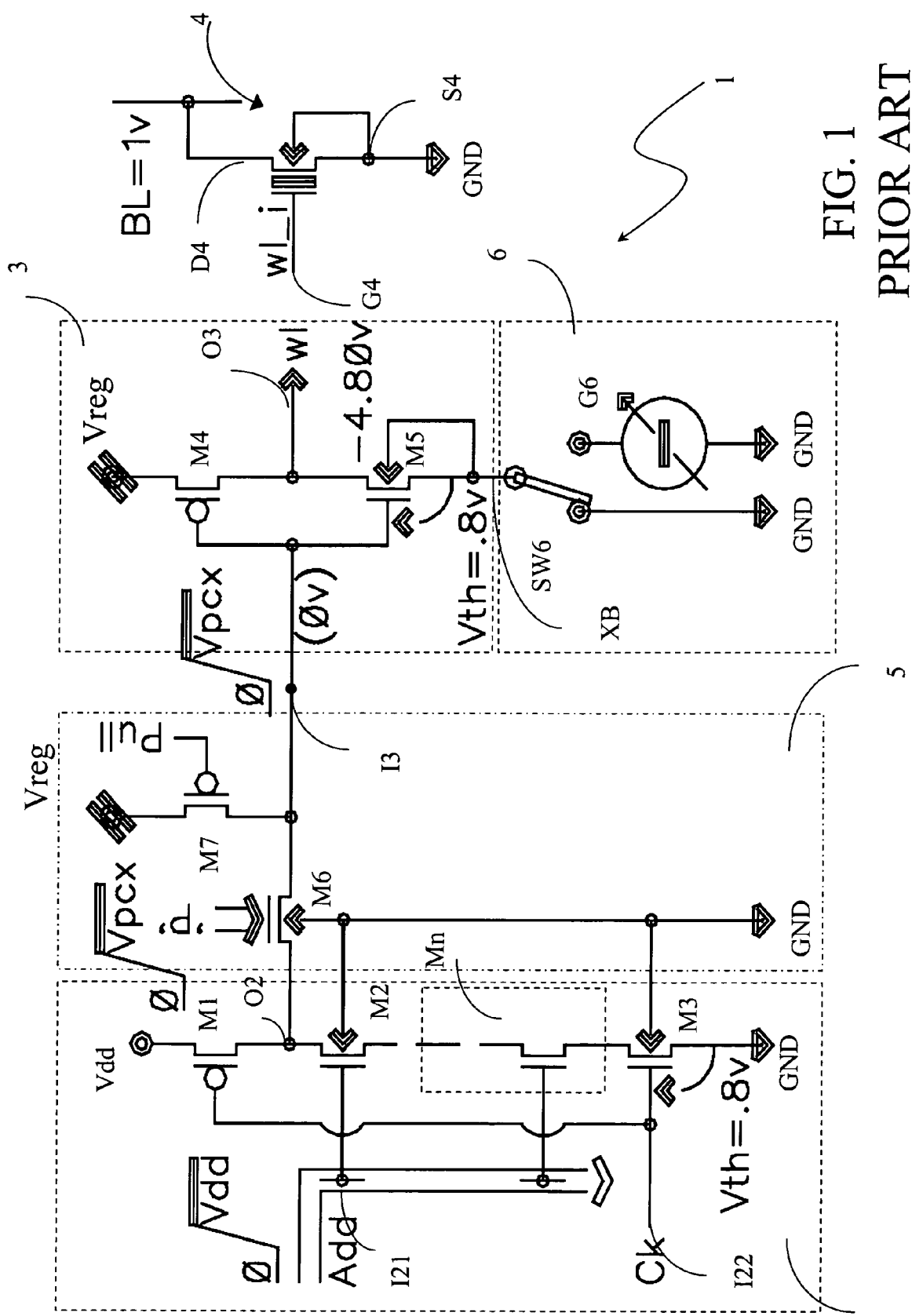
FIG. 1 is a schematic diagram of a row decoder circuit realized according to the prior art.

As it has been seen in relation to the circuits according to the prior art, the high negative voltage values to be applied to the deselected word lines (i.e., to the gate terminals of the deselected memory cells) for a correct execution of a depletion verify step without leakages corresponding to the cells in the deep depletion state ensure the correct interdiction of the transistors comprised in the row decoder circuits corresponding to these deselected word lines.

an embodiment of the present invention starts from the consideration that it is possible to "modulate" the interdiction of the transistors comprised in the row decoder circuit by using suitable negative voltages applied to the bulk terminals of these transistors for varying their threshold voltage values, i.e., it exploits the so called bulk effect. Moreover, this embodiment of the present invention exploits the application of suitable negative voltages for biasing the transistors and for allowing excursions higher than the voltage signals applied to the gate terminals of the same.

Advantageously according to an embodiment of the invention, a method is proposed for progressively amplifying a high negative voltage value applied to a word line, i.e., to a gate terminal of a memory cell, by a row decoder circuit by acting simultaneously and with progressive negative voltage values on the different stages comprised in this row decoder circuit.

In particular, this method comprises an application step of a first negative voltage V1 to an input stage and to an output stage of the row decoder circuit.

This first negative voltage V1 is generated by a suitable biasing device and it is applied to the bulk terminals of the transistors comprised in the input and output stage of the row decoder circuit.

In this way, the application of this first negative voltage V1 to the bulk terminals of the transistors allows to increase the threshold voltage value of these transistors, thanks to the so called bulk effect, increasing the negative voltage value which can be applied to their control terminals without triggering the conduction of the transistors, and thus increasing the negative voltage value which is made available on an output terminal of the row decoder circuit.

In other words, by biasing the bulk terminals of the transistors comprised in its output and input stages, the row decoder circuit is able to apply to the gate terminal of the memory cell a more negative voltage with respect to the row decoder circuits realized according to the prior art, without leakage risks due to depleted cells.

It is possible to consider the case wherein two voltages are applied to these bulk terminals, these voltages being distinct from each other but both negative so as to allow the row decoder circuit to separately exploit the bulk effect of the transistors comprised in the input stage and in the output stage.

In case, because it may be necessary to apply even more negative voltages to the gate terminal of the memory cell, advantageously according to an embodiment of the invention, the method comprises a second application step of a second negative voltage V2 to the input stage of the row decoder stage.

In particular, this second negative voltage V2 substitutes the ground reference and it is applied to a terminal of the input stage normally connected thereto.

In this way the possible excursion of the voltage values applicable to the terminals of the transistors in the input stage which passes from the ground-supply voltage range to an amplified range equal to V2 (which is a negative voltage)-supply voltage is increased, while maintaining the compatibility with control logic connected to the input stage (which keep on working in the natural ground-supply voltage range) thanks to an increased threshold voltage value of the transistors in this input stage.

It is possible to further increase the high negative voltage at the gate terminal of the memory cell by providing a third application step of a third negative voltage V3 to the output stage of the row decoder circuit.

Also in this case, the third negative voltage V3 substitutes the ground reference and it is applied to a terminal of the output stage normally connected thereto.

In this way also the possible excursion of the voltage values applicable to the terminals of the transistors in the output stage which passes from the ground-regulation voltage range to an amplified range equal to V3 (which is a negative voltage)-regulation voltage is increased.

In consequence, the high negative voltage generated on the output terminal of the row decoder circuit is increased.

In substance, a method according to an embodiment of the invention allows such an amplification of the high negative voltage value on an output terminal of the row decoder circuit as to ensure the correct operation of the same also in case of cells in the deep depletion state. It is a progressive amplification of this high negative voltage value obtained by acting on the bulk terminals of the transistors of the input and output stages and on the corresponding excursion ranges of voltages.

In particular, in case of a depletion verify step of a memory device, advantageously a method according to an embodiment of the invention allows amplifying the high negative voltage to be applied to the deselected rows to ensure the correct interdiction also of cells in the deep depletion state.

Advantageously according to an embodiment of the invention, these negative voltages are suitably generated by using, as biasing device, a row decoder block, already provided in the row decoder circuit, and they thus do not increase the area occupation of the row decoder circuit itself if not in negligible terms, for the necessary connections between the row decoder block, the input stage and the row driver.

Moreover, advantageously according to an embodiment of the invention, these negative voltages have progressive negative values, in particular the first negative voltage V1 is higher, in magnitude, than the second negative voltage V2 and the third negative voltage V3 has, in magnitude, an intermediate value between the first and the second negative voltages according to the relation:

$$V1 < V3 < V2$$

A method according to an embodiment of the invention may also comprise a fourth application step of a positive voltage V_s to the source terminal of the memory cell of the word line wl.

In this way also the interdiction of the memory cell 4 belonging to deselected rows is helped, in case of deep depletion state too, since the value of threshold voltage is increased by means of the bulk effect also for the matrix cells.

Figure 2:
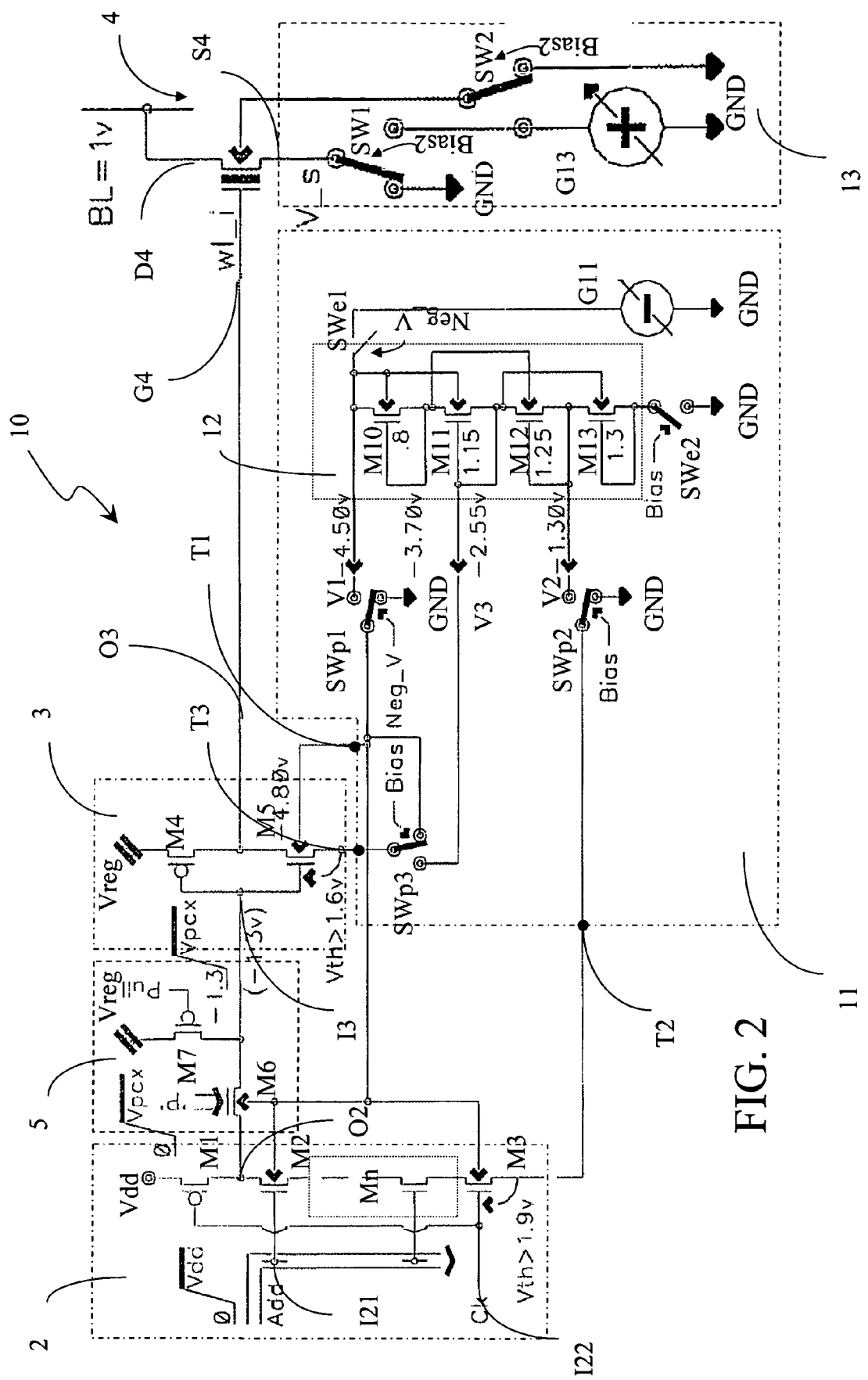
FIG. 2 is a schematic diagram of a row decoder circuit realized according to an embodiment of the invention.

With reference to these figures, and in particular to FIG. 2, a row decoder circuit is now described as realized according to an embodiment of the invention and suitable for implementing the method according to an embodiment of the invention. This row decoder circuit is globally indicated with 10.

By way of illustration, elements being structurally and functionally similar to the row decoder circuit described in relation with the prior art will be given the same reference numbers.

The row decoder circuit 10 thus comprises an input stage 2 connected to an output stage, in particular a row driver 3, by means of a decoupling stage 5.

The row driver 3 has an output terminal O3 connected to a word line wl, in particular to a control or gate terminal G4 of the memory cells 4 of the word line.

As it has been seen in relation with the prior art, the input stage 2 is connected to a first supply voltage reference, in particular, a supply voltage Vdd, and it has a first input terminal I21 connected to an address buffer Add, as well as a second input terminal I22 receiving a clock signal, Ck. The input stage 2 comprises a first transistor M1, a second transistor M2 and a third transistor M3, as well as selection transistors Mn.

The signals applied to the input stage 2 can vary between the ground GND (0V) and the supply voltage Vdd, generally equal to 3V.

The input stage 2 also has an output terminal O2 connected, by means of the decoupling stage 5, to an input terminal I3 of the row driver 3.

In turn, the row driver 3 is connected to a second supply voltage reference, in particular a regulation voltage Vreg, and it comprises a first transistor M4 and a second transistor M5 with gate terminals connected to each other and to the input terminal I3 of the row driver 3. The transistors M4 and M5 are interconnected in correspondence with an output terminal O3 of the row driver 3, in turn connected to a word line wl, i.e., to the gate terminal G4 of the memory cells 4 of this word line.

The signals applied to the row driver 3 can vary between the ground GND (0V) and a programming voltage value Vpcx, distinct from the supply voltage Vdd and generally equal to 9V.

The decoupling stage 5 comprises a first transistor M6, inserted between the output terminal O2 of the input stage 2 and the input terminal I3 of the row driver 3 and having a gate terminal biased by means of a suitable signal P, as well as a second transistor M7, inserted between the regulation voltage value Vreg and the input terminal I3 of the row driver 3 and it has a gate terminal suitably driven by means of a signal Pull.

Also the signals applied to the decoupling stage 5 can vary between the ground GND (0V) and the programming voltage Vpcx (generally equal to 9V).

Advantageously according to an embodiment of the invention, the row decoder circuit 10 also comprises a biasing device 11, connected to a third voltage reference, in particular to a ground GND, and having a first T1, a second T2, and a third biasing terminal T3.

In particular, the first biasing terminal T1 is connected to the bulk terminals of the second M2 and of the third transistor M3 of the input stage 2, of the first transistor M6 of the decoupling stage 5, as well as of the second transistor M5 of the row driver 3, i.e., to the bulk terminals of the NMOS transistors comprised in the row decoder circuit 10.

The second biasing terminal T2 is connected to the input stage 2 in correspondence with a conduction terminal, in particular of the source terminals of the third transistor M3 of this input stage 2.

The third biasing terminal T3 is instead connected to the row driver 3, in correspondence with a conduction terminal, in particular the source terminal of the second transistor M5 of the row driver 3.

Advantageously according to an embodiment of the invention, the biasing device 11 comprises a generator G11 of a negative voltage, suitably connected, by means of a first enable switch SWe1, and a divider 12, in turn connected, by means of a second enable switch SWe2, to the ground GND.

The divider 12 comprises a first M10, a second M11, a third M12 and a fourth transistor M13 being diode-like configured and inserted, in series with each other, between the first SWe1 and the second enable switch SWe2.

Advantageously, the first M10 and the second transistor M1 have bulk terminals connected to each other and to the first enable switch SWe1. Moreover, the first transistor M10 has a source terminal connected to the bulk terminal of the third transistor M12, having in turn the drain terminal connected to the terminal of the fourth transistor M13.

Thanks to the particular configuration of the divider 12, on the source terminal of the first transistor M10 there is a first negative voltage V1, in the example shown in FIG. 2 equal to −4.50V. Moreover, on the gate terminal of the third transistor M12, shared by the source terminal of the fourth transistor M13, there is a second negative voltage V2, in the example shown in FIG. 2 equal to −1.30V. Finally, on the gate terminal of the second transistor M11, shared by the source terminal of the third transistor M12, there is a third negative voltage V3, in the example shown on FIG. 2 equal to −2.55V.

Advantageously according to an embodiment of the invention, the biasing device 11 comprises a first biasing switch SWp1 connected, in a fixed way, to the first biasing terminal T1 and, in an alternated way, to the ground reference GND and to the source terminal of the first transistor M10 so as to apply to this first biasing terminal T1 the ground GND or the first negative voltage V1 alternatively.

Moreover, the biasing device 11 comprises a second biasing switch SWp2 connected, in a fixed way, to the second biasing terminal T2 and, in an alternated way, to the gate terminal of the third transistor M12 of the divider 12 so as to apply to this second biasing terminal T2 the ground GND or the second negative voltage V2 alternatively.

Finally, the biasing device 11 comprises a third biasing switch SWp3 connected, in a fixed way, to the third biasing terminal T3 and, in an alternated way, to the gate terminal of the second transistor M11 of the divider 12 and to the first biasing terminal T1 so as to apply to this third biasing terminal T3 the third negative voltage V3 or, alternatively, to connect it to the first biasing terminal T1.

In particular, the first enable switch SWe1 and the first biasing switch SWp1 are driven by a first biasing control signal Neg_V, while the second enable Swe2, as well as the second SWp2 and the third biasing switch SWp3 are driven by a second biasing control signal Bias. It is however possible to consider distinct biasing control signals for different switches, separately realizing the desired biasing.

Similarly, it is possible to provide, in place of the first biasing terminal T1, a pair of terminals for biasing, in a distinct way, the bulk terminals of the input and output stages.

Advantageously according to an embodiment of the invention, the row decoder circuit 10 comprises a biasing block 13 connected to the source terminal of the cells 4 and the ground GND.

The biasing block 13 comprises a generator G13 of a positive voltage V_s connected, by means of a first SW1 and a second switch SW2, respectively to the source terminal and to the bulk terminal of the cells 4. In particular, the first switch SW1 is connected, in a fixed way, to the source terminal of the cells 4 and, in an alternated way, to the ground reference GND and to the generator 13, while the second switch SW2 is connected, in a fixed way, to the bulk terminal of the cells 4 and, in an alternate way, to the ground reference and to the generator 13. The switches SW1 and SW2 are suitably driven by a third biasing control signal Bias2.

It is noted that this positive voltage V_s is suitably set at such a value as not to jeopardize the correct operation of the memory device as a whole, and, in particular, of the matrix reading devices usually used. An example of such a suitable value is +0.4V.

Figure 3A:
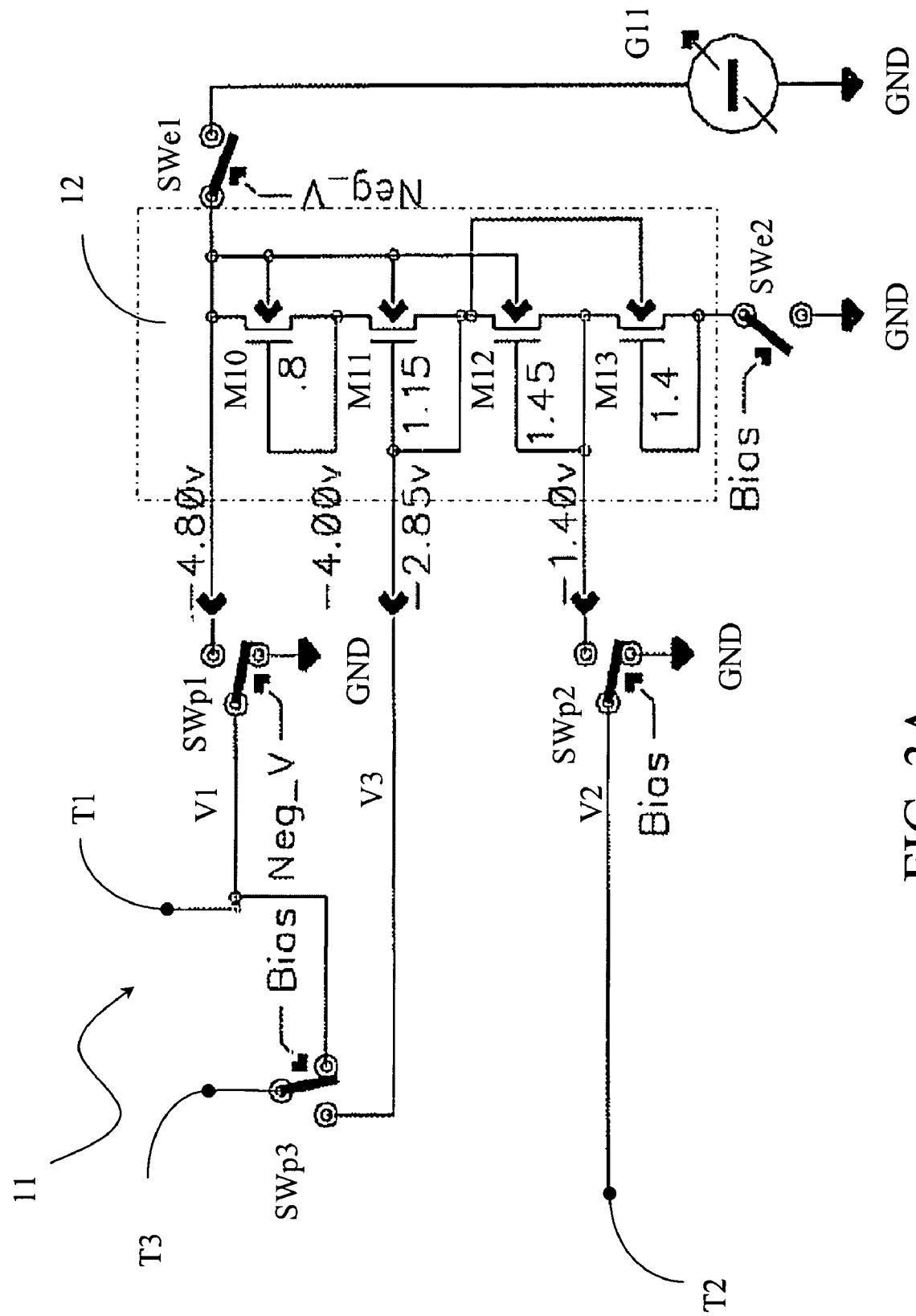
FIGS. 3A and 3B are schematic diagrams of further embodiments of a detail of the circuit of FIG. 2.
Figure 3B:
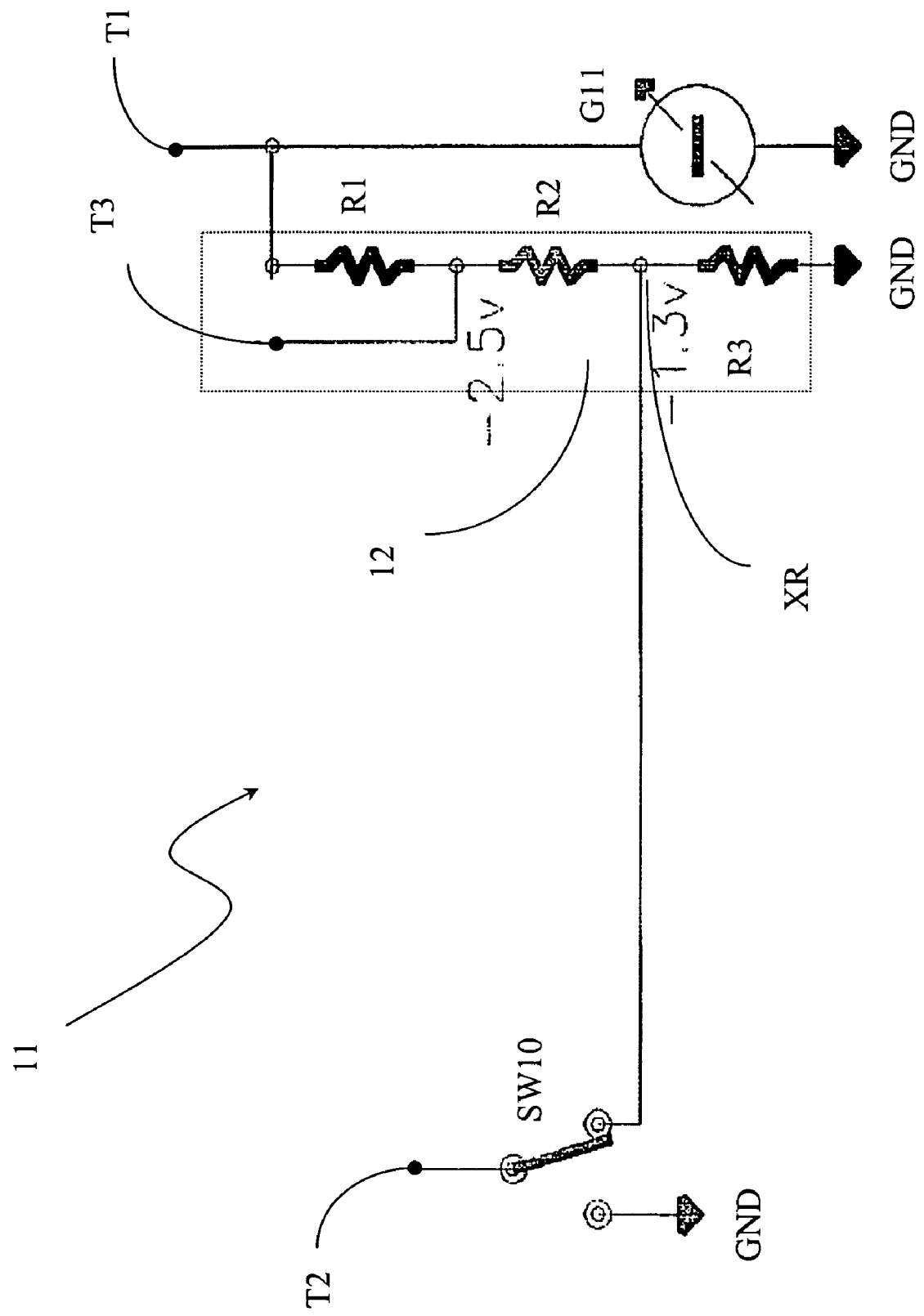

It is also possible to realize the biasing device 11 with different configurations as schematically shown in FIGS. 3A and 3B.

In particular, making reference to FIG. 3A, the biasing device 11 always comprises a divider 12 connected to the biasing terminals T1-T3 and to the voltage references (GND, G11) by means of suitable switches. In this case, the first M10, the second M11 and the third transistor M12 of the divider 12 have however bulk terminals connected to each other and to the first enable switch SWe1.

In this way, the negative voltage values on the drain terminals of these transistors vary and in particular it results:
V1=−4.80V
V2=−1.40V
V3=−2.85V FIG. 3B shows instead a resistive configuration of the biasing device 11.

In this case, the biasing device 11 comprises a divider 12 realized by a first R1, by a second R2 and by a third resistive element R3 inserted, in series with each other, between the first biasing terminal T1 and the ground GND.

In particular, the first resistive element R1 has a first end connected to the first biasing terminal T1 and a second end connected to the third biasing terminal T3.

The second resistive element R2 has a first end connected to the second end of the first resistive element R1 and a second end connected to an intermediate circuit node XR, in turn connected, by means of a switch SW10, to the second biasing terminal T2. In particular, the switch SW10 is connected, in a fixed way, to the second biasing terminal T2 and, in an alternated way, to the intermediate circuit node XR and to the ground GND.

Finally, the third resistive element R3 has a first end connected to the intermediate circuit node XR and a second end connected to the ground GND.

The biasing device 11 also comprises a generator G11 inserted between the first biasing terminal T1 and the ground GND.

This further embodiment of the biasing device 11 is extremely simple, but it has a slight current consumption due to the presence of the resistive elements connected to the generator G11.

Let's now see the operation of the row decoder circuit 10 of FIG. 2 according to an embodiment of the invention.

The first biasing control signal Neg_V causes the closure:
of the first enable switch SWe1, which connects the divider 12 to the generator G11; and
of the first biasing switch SWp1, which applies the first negative voltage V1 to the first biasing terminal T1.

In particular, the first negative voltage V1 negatively biases the bulk terminals of the transistors M2 and M3 of the input stage 2, of the transistor M6 of the decoupling stage 5, and of the transistor M5 of the row driver 3 so as to increase the threshold voltage values thereof, in the example shown equal to at least 1.9V.

It is to be noted that the first negative voltage V1 substantially biases the P-well of the entire row decoder circuit to a suitably negative voltage (in the example equal to −4.5V). It is also possible to separate the wells wherein the transistors of the input 2 and output 3 stages are realized and to arrange distinct biasings, at the expense of a complication of the biasing device 11.

Moreover, the second biasing control signal Bias causes the closure:

of the second enable switch SWe2, which connects the divider 12 to the ground GND;

of the second biasing switch SWp2, which applies the second negative voltage V2 to the second biasing terminal T2; and of the third switch SWp3, which applies the third negative voltage V3 to the third biasing terminal T3.

In particular, the second negative voltage V2 negatively biases the source of the third transistor M3 of the input stage 2 so as to modify the excursion of the output O2 extending it in the field of the negative values, allowing application of a negative voltage value to the input terminal I3 of the row driver 3 without making the transistor M5 contained therein to conduct. In the example shown in FIG. 2, the threshold voltage of the third transistor M3 of the input stage 2 raises to values higher than 1.9V ensuring the compatibility with the dynamics of the control logic which operates in the ground GND-supply voltage Vdd range.

This allows interfacing, without consumption problems, the input stage 2 having a supply voltage Vdd typically equal to 3V with the remaining part of the row decoder circuit connected to the high voltage Vpcx, generally equal to 9V.

Moreover, the third negative voltage V3 applied to the source terminal of the second transistor M5 of the row driver 3 allows an increase in the voltage excursion applicable to this transistor M5, whose gate terminal is, thanks to the biasing of the input stage 2, at a negative voltage value equal to V1=−1.3V. In the example shown in FIG. 2, the threshold voltage of the second transistor M5 of the row driver 3 raises to values higher than 1.6V.

Finally, the third biasing control signal Bias2 causes the closure of the first SW1 and of the second switch SW2 of the biasing block 13 and thus the application of the positive voltage V_S to the source terminal of the cells 4.

In this way, the row decoder circuit 10 according to an embodiment of the invention biases the deselected rows at a negative voltage equal to −2.5V which, summed to a positive voltage applied to the source of the cells in the depletion verify step (equal to +0.4V in this embodiment) allows the interdiction also of cells in the deep depletion step, i.e., with threshold <−3V.

Under these conditions it is possible to apply to the gate terminal of the selected cells a suitable value Vreg to carry out the depletion verify step, without incurring unsuitable variations of this signal due to the deselected cells which, thanks to the biasing introduced by the row decoder circuit 10 according to an embodiment of the invention, are surely off, even when in deep depletion state.

The behavior of the row decoder circuit 10 according to an embodiment of the invention is graphically shown in FIGS. 4A-4B and 5A-5B.

In particular, FIG. 4A shows the threshold voltage variation with the increase of the voltage Vbs applied to the transistors of the circuit, while FIG. 4B shows the progress of the voltage value Vgs−Vth in the presence of the biasings introduced by the row decoder circuit 10 according to an embodiment of the invention. In particular, the progress of the curves as shown is caused by the application of the first negative voltage V1 to the bulk terminals of the NMOS transistors of the input 2 and output 3 stages of the row decoder circuit 10 while the shift downwards is obtained with the application of the second negative voltage V2 (line B) and of the third negative voltage (line C), with respect to a row decoder circuit realized according to the prior art (line A). It is immediate to verify how the threshold voltage increases in the direction of the arrow F.

In substance, these FIGS. 4A and 4B graphically show the variations undergone by the threshold voltage of the n-channel transistors of the chain in the row decoder circuit 10 due to the so called body effect, according to the voltage applied to the respective source terminal. These FIGS. 4A and 4B graphically show the effects obtained by the row decoder circuit 10 devoid of the biasing block 13 and suitable for implementing the method according to an embodiment of the invention.

Figure 5A:
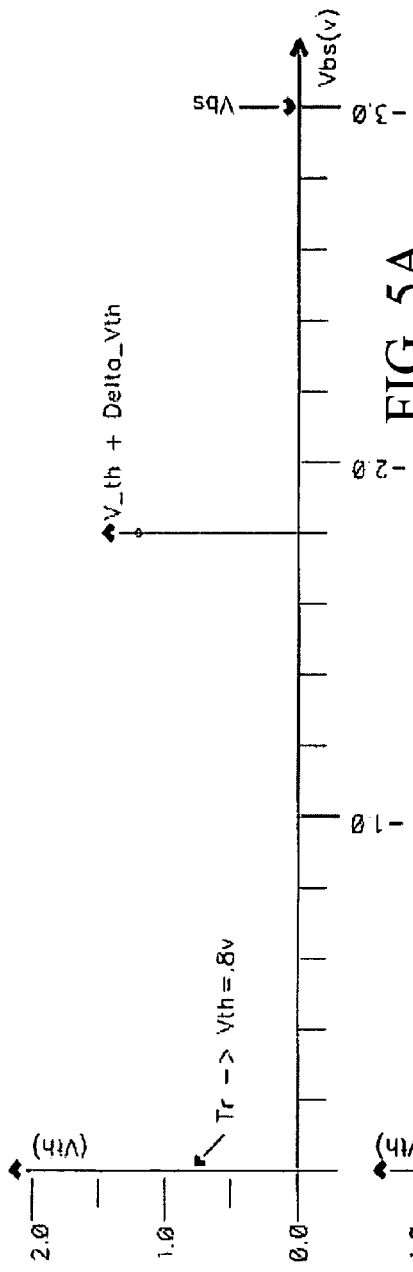
FIGS. 5A and 5B are qualitative plots of the variations of parameters inside the circuit of FIG. 2 by applying the method according to another embodiment of the invention.
Figure 5B:
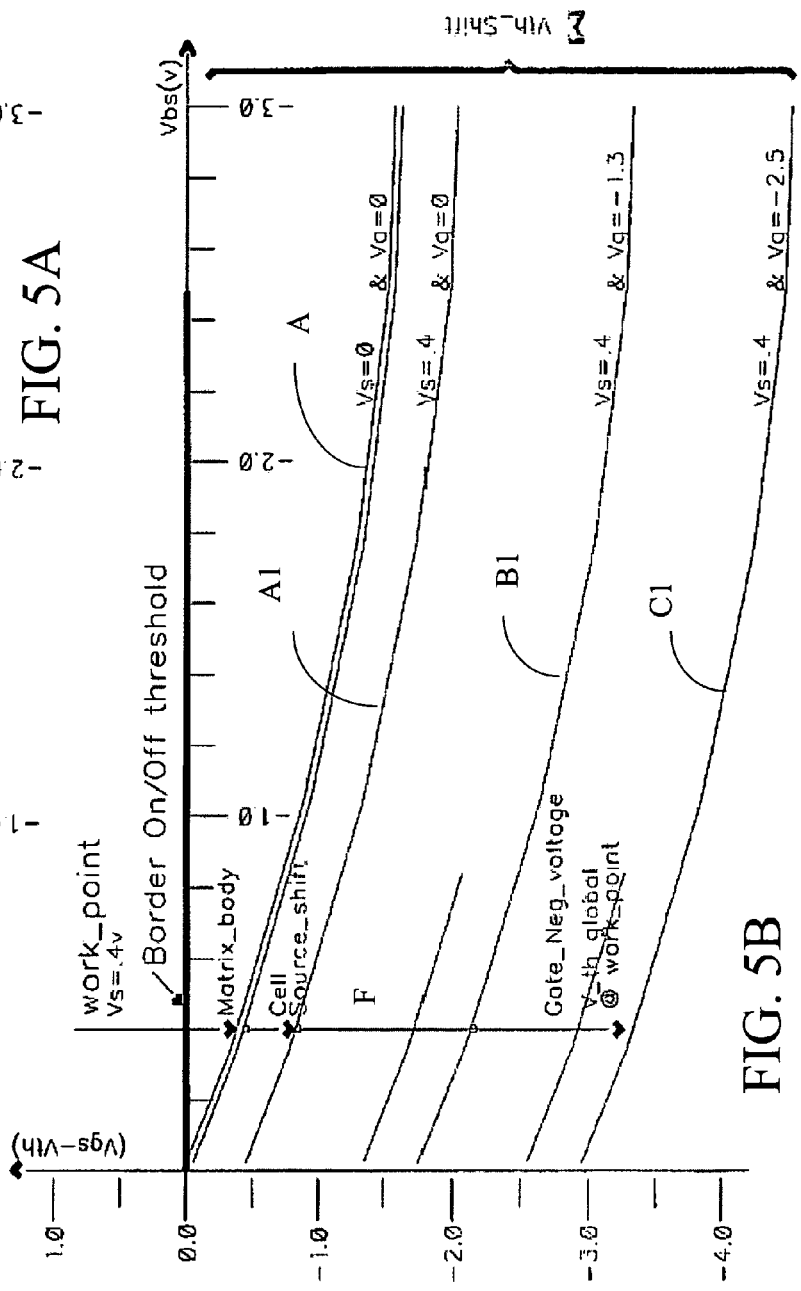

Similarly, FIG. 5A shows the variation of threshold voltage with the increase of the voltage Vbs as applied to the transistors of the circuit, while FIG. 5B shows the progress of the voltage value Vgs−Vth in the presence of the biasings introduced by the row decoder circuit 10 according to an embodiment of the invention, with a shift which is due, respectively, to the application of the V_s=+0.4V to the source terminal of the cells 4 (line A1), to the application of the second negative voltage V2 (line B1) and of the third negative voltage (line C1), with respect to a row decoder circuit realized according to the prior art (line A), with the indication of a working point with VS=+0.4. It is immediate to verify how the threshold voltage increases in the direction of the arrow F.

In substance, these FIGS. 5A and 5B graphically show the variations undergone by the threshold voltages of the n-channel transistors of the chain in the row decoder circuit 10 due to the so called body effect, according to the voltage applied to the respective source terminal. These FIGS. 5A and 5B graphically show the effects obtained by the row decoder circuit 10 suitable to implement an embodiment of the method according to an embodiment of the invention.

It is to be noted that the biasing device 11 used by the row decoder circuit 10 according to an embodiment of the invention can be advantageously realized outside the pitch of the memory cells and that thus the row decoder circuit 10 influences the area occupation only for the connections to be established between the biasing device 11 and the input stage 2, the decoupling stage 5 and the row driver 3. In other words, the row decoder circuit 10 does not need any additional circuitry in the matrix, but only additional connections, which are negligible in terms of integration area, solving, de facto, the main problem of the circuits realized according to the prior art wherein the level shifter circuits impose heavy area occupation increases of the row decoder circuit as a whole.

In this way, advantageously according to an embodiment of the invention, a drastic area reduction of the row decoder circuit 10 is obtained, estimated to be at least equal to 50% with respect to the traditional circuits with management of the negative voltages.

Referring again to FIG. 2, the row decoder circuit 10 may be part of an integrated circuit (IC) such as a flash memory IC, which may be part of an electronic system such as a computer system.

From the foregoing it will be appreciated that, although specific embodiments of the invention have been described herein for purposes of illustration, various modifications may be made without deviating from the spirit and scope of the invention.

What is claimed is:

1. A row decoder circuit for a memory matrix of the type comprising:
   at least one input stage connected to a to a supply voltage reference and MOS transistors
   an output stage being connected to a second supply voltage reference and having at least one output terminal connected to a word line of the memory matrix
   the input stage being also connected to the output stage
   wherein the row decoder circuit further comprises:
      a biasing device, connected to a third supply voltage reference and comprising at least one generator of a negative voltage; and
      a divider connected to a first biasing terminal of the biasing device,
   the generator of a negative voltage being connected to a divider and
   the first biasing terminal being connected to at least the input stage in correspondence with bulk terminals of the MOS transistors comprised in the input stage and being suitable for supplying it with a first negative voltage.

2. The row decoder circuit according to claim 1, wherein the first biasing terminal is further connected to the output stage in correspondence with bulk terminals of MOS transistors comprised in the output stage and being suitable for supplying it with the first negative voltage.

3. The row decoder circuit according to claim 1, wherein the divider is connected to a second biasing terminal of the biasing device, the second biasing terminal being in turn connected to the input stage in correspondence with a conduction terminal of a MOS transistor comprised in the input stage and being suitable for supplying it with a second negative voltage.

4. The row decoder circuit according to claim 1, wherein the divider is connected to a third biasing terminal of the biasing device, the third biasing terminal being in turn connected to the output stage in correspondence with a conduction terminal of a MOS transistor comprised in the output stage and being suitable for supplying it with a third negative voltage.

5. The row decoder circuit according to claim 1, the row decoder circuit being of the type comprising at least one decoupling stage inserted between the input and output stages and connected to the second supply voltage reference, wherein the first biasing terminal is further connected to the decoupling stage in correspondence with a bulk terminal of a MOS transistor comprised in the decoupling stage.

6. The row decoder circuit according to claim 1, wherein the generator of a negative voltage is connected, by means of a first enable switch, to the divider and in that the divider is connected, by means of a second enable switch, to the third supply voltage reference.

7. The row decoder circuit according to claim 6, wherein the divider comprises at least one first, one second, one third and one fourth transistor being diode-like configured and inserted, in series to each other, between the first and the second enable switch, the first transistor having a conduction terminal suitable for supplying a first negative voltage, the third transistor having a control terminal suitable for supplying a second negative voltage and the second transistor having a control terminal suitable for supplying a third negative voltage.

8. The row decoder circuit according to claim 7, wherein the first transistor has a bulk terminal connected to a bulk terminal of the second transistor and to the first enable switch and a conduction terminal connected to a bulk terminal of the third transistor, having in turn a conduction terminal connected to a bulk terminal of the fourth transistor.

9. The row decoder circuit according to claim 7, wherein the first, second and third transistors have bulk terminals connected to each other and to the first enable switch, the second transistor having a conduction terminal connected to a bulk terminal of the fourth transistor.

10. The row decoder circuit according to claim 7, further comprising a first biasing switch connected, in a fixed way, to the biasing terminal and, in an alternated way, to the third supply voltage reference and to the conduction terminal of the first transistor of the divider.

11. The row decoder circuit according to claim 7, further comprising a second biasing switch connected, in a fixed way, to (he second biasing terminal and, in an alternated way, to the third supply voltage reference and to the control terminal of the third transistor of the divider.

12. The row decoder circuit according to claim 7, further comprising a third biasing switch connected, in a fixed way, to the third biasing terminal and, in an alternated way, to the control terminal of the second transistor of the divider and to the first biasing terminal.

13. The row decoder circuit according to claims 10, wherein the enable and biasing switches are driven by biasing control signals.

14. The row decoder circuit according to claims 11, wherein the enable and biasing switches are driven by biasing control signals.

15. The row decoder circuit according to claims 12, wherein the enable and biasing switches are driven by biasing control signals.

16. The row decoder circuit according to claim 1, further comprising a biasing block connected between source terminals of memory cells of the word line and the third supply voltage reference and comprising at least one generator of a positive voltage connected, by means of a first and a second switch respectively to the source terminals and to bulk terminals of the cells.

17. The row decoder circuit according to claim 16, wherein the first switch is connected, in a fixed way, to the source terminals of the cells and, in an alternated way, to the third supply voltage reference and to the generator and in that the second switch is connected, in a fixed way, to the bulk terminals of the cells and, in an alternated way, to the third supply voltage reference and to the generator.

18. The row decoder circuit according to claim 16, wherein the switches are driven by a biasing control signal.

19. The row decoder circuit according to claim 16, wherein the generator supplies a positive voltage having a value set so as to ensure a correct operation of a memory device comprising the cells.

20. The row decoder circuit according to claim 1, wherein the divider comprises a first, a second and a third resistive element inserted, in series to each other, between the generator of a negative voltage and the third supply voltage reference.

21. The row decoder circuit according to claim 20, wherein:
   the first resistive element has a first end connected to the generator of a negative voltage in correspondence with the first biasing terminal;
   the second resistive element has a first end connected to a second end of the first resistive element and a second end connected to an intermediate circuit node; and
   the third resistive element has a first end connected to the intermediate circuit node and a second end connected to the third supply voltage reference.

22. The row decoder circuit according to claim 21, wherein the first biasing terminal is further connected to the output stage in correspondence with bulk terminals of MOS transistors comprised in the output stage and being suitable for supplying it with the first negative voltage.

23. The row decoder circuit according to claim 21, wherein the first switch is connected, in a fixed way, to a second biasing terminal of the biasing device and, in an alternated way, to the intermediate circuit node and to the third supply voltage reference, the second biasing terminal being in turn connected to the input stage in correspondence with a conduction terminal of a MOS transistor comprised in the input stage and being suitable for supplying it with a second negative voltage.

24. The row decoder circuit according to claim 21, wherein the second end of the first resistive element is further connected to a third biasing terminal of the biasing device, the third biasing terminal being in turn connected to the output stage in correspondence with a conduction terminal of a MOS transistor comprised in the output stage and being suitable for supplying it with a third negative voltage.

25. The row decoder circuit according to claim 1, further comprising, as biasing device, a row decoder block.

26. The row decoder circuit according to claim 1, further comprising a biasing terminal connected to the output stage in correspondence with bulk terminals of MOS transistors comprised in the output stage and being suitable for supplying it with a further negative voltage.

27. The row decoder circuit according to claim 1, wherein the negative voltages have progressive negative values, the first negative voltage having a value which is lower than the second negative voltage and the third negative voltage having an intermediate value which is between the first and the second negative voltage according to the relation:

$$V1<V3<V2$$

28. A method for progressively amplifying a high negative voltage to be applied to a word line of a memory matrix, the high negative voltage being generated by means of a row decoder circuit of the type comprising at least one input stage connected to a first supply voltage reference and to an output stage connected to a second supply voltage reference, the output stage having at least one output terminal connected to the word line and suitable for applying to it the high negative voltage, the method comprising at least one first application step of a first negative voltage to the input stage of the row decoder circuit in correspondence with bulk terminals of transistors comprised in the input stage, wherein the negative voltages have progressive negative values, the first negative voltage having a value which is lower than a second negative voltage and a third negative voltage having an intermediate value which is between the first and the second negative voltage according to the relation V1<V3<V2.

29. The method according to claim 28, wherein the first application step of the first negative voltage further comprises an application step of the first negative voltage to the output stage of the row decoder circuit in correspondence with bulk terminals of transistors comprised in the output stage.

30. The method according to claim 29, further comprising a second application step of the second negative voltage to the input stage in correspondence with a conduction terminal of a transistor comprised in the input stage.

31. The method according to claim 30, further comprising a third application step of the third negative voltage to a conduction terminal of at least one MOS transistor comprised in the output stage.

32. The method according to claim 28, further comprising a biasing step by means of a positive voltage of source terminals of memory cells belonging to the word line.

33. The method according to claim 28, wherein the negative voltages are generated by using a biasing device comprised in the row decoder circuit.

34. The method according to claim 33, wherein it uses, as biasing device, a row decoder block comprised in the row decoder circuit.

35. A row decoder, comprising:
   a drive node operable to be coupled to a word line to which is coupled a first nonvolatile memory cell;
   an output transistor having a first conduction node coupled to the drive node, a second conduction node, a control node, and a bulk node;
   an input transistor having a first conduction node coupled to the control node of the output transistor, a second conduction node, and a bulk node; and
   a bias circuit coupled to the output transistor and to the input transistor and operable to couple a first negative voltage to the second conduction node of the output transistor, a second negative voltage to the bulk node of the output transistor, and a third negative voltage to one of the second conduction and bulk nodes of the input transistor, the first negative voltage being different than the second negative voltage.

36. The row decoder of claim 35 wherein the first negative voltage is greater than the second negative voltage.

37. The row decoder of claim 35 wherein the bias circuit is operable to respectively couple the first and second negative voltages to the second conduction and bulk nodes of the output transistor during an erase evaluation of a second memory cell, and to couple ground to the second conduction and bulk nodes of the output transistor during a reading of the first memory cell.

38. The row decoder of claim 35 wherein the bias circuit is operable to generate the first and second negative voltages.

39. The row decoder of claim 35 wherein the first negative voltage is low enough to prevent the memory cell from conducting during an erase evaluation while the memory cell is unselected.

40. The row decoder of claim 35, wherein the bias circuit is operable to couple the third negative voltage to the second conduction node of the input transistor.

41. The row decoder of claim 35, wherein the bias circuit is operable to couple the third negative voltage to the bulk node of the input transistor.

42. A row decoder, comprising:
   a drive node operable to be coupled to a word line to which is coupled a first nonvolatile memory cell;
   an output transistor having a first conduction node coupled to the drive node, a second conduction node, a control node, and a bulk node;
   a bias circuit coupled to the transistor and operable to couple a first negative voltage to the second conduction node and a second negative voltage to the bulk node, the first negative voltage being different than the second negative voltage;
   an input transistor having a first conduction node coupled to the control, node of the output transistor, a second conduction node, and a bulk node; and
   wherein the bias circuit is further coupled to the input transistor and is further operable to couple a third negative voltage to the second conduction node of the input transistor and a fourth negative voltage to the bulk node of the input transistor.

43. A row decoder, comprising:
a drive node operable to be coupled to a word line to which is coupled a first nonvolatile memory cell;
an output transistor having a first conduction node coupled to the drive node, a second conduction node, a control node, and a bulk node;
a bias circuit coupled to the transistor and operable to couple a first negative voltage to the second conduction node and a second negative voltage to the bulk node, the first negative voltage being different than the second negative voltage;
an input transistor having a fast conduction node coupled to the control node of the output transistor, a second conduction node, and a bulk node; and
wherein the bias circuit is further coupled to the input transistor and is further operable to couple a third negative voltage to the second conduction node of the input transistor and the second negative voltage to the bulk node of the input transistor.

44. A row decoder, comprising:
a drive node operable to be coupled to a word line to which is coupled a first nonvolatile memory cell;
an output transistor having a first conduction node coupled to the drive node, a second conduction node, a control node, and a bulk node;
a bias circuit coupled to the transistor and operable to couple a first negative voltage to the second conduction node and a second negative voltage to the bulk node, the first negative voltage being different than the second negative voltage;
an intermediate transistor having a first conduction node, a second conduction node coupled to the control node of the output transistor, and a bulk node;
an input transistor having a first conduction node coupled to the first conduction node of the intermediate transistor, a second conduction node, and a bulk node; and
wherein the bias circuit is further coupled to the intermediate and input transistors and is further operable to couple a third negative voltage to the second conduction node of the input transistor, a fourth negative voltage to the bulk node of the input transistor, and a fifth negative voltage to the bulk node of the intermediate transistor.

45. A row decoder, comprising:
a drive node operable to be coupled to a word line to which is coupled a first nonvolatile memory cell;
an output transistor having a first conduction node coupled to the drive node, a second conduction node, a control node, and a bulk node; and
a bias circuit coupled to the transistor and operable to couple a first negative voltage to the second conduction node and a second negative voltage to the bulk node, the first negative voltage being different than the second negative voltage.
an intermediate transistor having a first conduction node, a second conduction node coupled to the control node of the output transistor, and a bulk node;
an input transistor having a first conduction node coupled to the first conduction node of the intermediate transistor, a second conduction node, and a bulk node; and
wherein the bias circuit is further coupled to the intermediate and input transistors and is further operable to couple a third negative voltage to the second conduction node of the input transistor and the second negative voltage to the bulk nodes of the input and intermediate transistors.

46. A memory, comprising:
a bit line;
a word line;
a nonvolatile memory cell having a control node coupled to the word line, a first conduction node coupled to the bit line, and a second conduction node; and
a row decoder, comprising,
   an output transistor having a first conduction node coupled to the word line, a second conduction node, a control node, and a bulk node;
   an input transistor having a first conduction node coupled to the control node of the output transistor, a second conduction node, and a bulk node; and
   a first bias circuit coupled to the output transistor and to the input transistor and operable to couple a first negative voltage to the second conduction node of the output transistor, a second negative voltage to the bulk node of the output transistor, and a third negative voltage to one of the second conduction and bulk nodes of the input transistor, the first negative voltage being different than the second negative voltage.

47. The memory of claim 46, further comprising a second bias circuit operable to couple a positive voltage to the second conduction node of the I memory cell during an erase evaluation while the memory cell is unselected.

48. A memory, comprising:
a bit line;
a word line;
a nonvolatile memory cell having a control node coupled to the word line, a first conduction node coupled to the bit line, and a second conduction node; and
a row decoder, comprising:
   an output transistor having a first conduction node coupled to the word line, a second conduction node, and a bulk node;
   a first bias circuit coupled to the transistor and operable to couple a first negative voltage to the second conduction node of the transistor and a second negative voltage to the bulk node, the first negative voltage being different than the second negative voltage; and
   a second bias circuit operable to couple a positive voltage to the second conduction node of the memory cell during an erase evaluation while the memory cell is unselected and to couple a non-positive voltage to the second conduction node of the memory cell during a read of the memory cell.

49. A memory, comprising:
a bit line;
a word line;
a nonvolatile memory cell having a control node coupled to the word line, a first conduction node coupled to the bit line, and a second conduction node; and
a row decoder, comprising:
   an output transistor having a first conduction node coupled to the word line, a second conduction node, and a bulk node;
   a first bias circuit coupled to the transistor and operable to couple a first negative voltage to the second conduction node of the transistor and a second negative voltage to the bulk node, the first negative voltage being different than the second negative voltage, wherein the first bias circuit is operable to couple the first and second negative voltages to the second conduction and bulk nodes of the transistor during an erase evaluation while the memory cell is unselected; and a second bias circuit operable to couple a positive voltage to the second conduction node of the memory cell during the erase evaluation while the memory cell is unselected.

50. An electronic system, comprising:
a memory, comprising,
   a bit line,
   a word line,
   a nonvolatile memory cell having a control node coupled to the word line, a first conduction node coupled to the bit line, and a second conduction node, and
   a row decoder, comprising,
      an output transistor having a first conduction node coupled to the word line, a second conduction node, a control node, and a bulk node;
      an input transistor having a first conduction node, a second conduction node, and a bulk node; and
      a first bias circuit coupled to the output transistor and to the input transistor and operable to couple a first negative voltage to the second conduction node of the output transistor, a second negative voltage to the bulk node of the output transistor, and a third negative voltage to the second conduction node of the input transistor, the first negative voltage being different than the second negative voltage.

51. A method, comprising:
changing the threshold voltage of a first output transistor;
prohibiting an erased first nonvolatile memory cell from conducting a current greater than a predetermined current with the output transistor having the increased threshold voltage by coupling a control node of the first nonvolatile memory cell to a second negative voltage with the first output transistor during an evaluation of an erase level of a second nonvolatile memory cell; and
increasing the threshold of the output transistor and coupling the control node of the first memory cell to a non-negative voltage with a second output transistor during an evaluation of an erase level of the first nonvolatile memory cell.

52. The method of claim 51 wherein prohibiting comprises coupling a control node of the first nonvolatile memory cell to a negative voltage with the output transistor having the increased threshold voltage.

53. A method, comprising:
coupling a bulk node of a first output transistor to a first negative voltage;
while reading an erased first non-volatile memory cell, coupling a control node of an erased second non-volatile memory cell to a second negative voltage with the output transistor, the second negative voltage being different than the first negative voltage; and
while reading the erased second non-volatile memory cell, deactivating the first output transistor and coupling the control node of the second memory cell to a non-negative voltage with a second output transistor.

54. The method of claim 53, further comprising:
coupling a bulk node of a third output transistor to the first negative voltage; and
coupling a control node of the erased first non-volatile memory cell to the second negative voltage with the third output transistor while reading the erased second. non- volatile memory cell.

* * * * *

UNITED STATES PATENT AND TRADEMARK OFFICE
CERTIFICATE OF CORRECTION

PATENT NO. : 7,525,851 B2
APPLICATION NO. : 11/434564
DATED : April 28, 2009
INVENTOR(S) : Luigi Pascucci and Paolo Rolandi It is certified that error appears in the above-identified patent and that said Letters Patent is hereby corrected as shown below:

Column 11:
Line 3, "to a to a" should be --to a first--.

Column 12:
Line 15, "(he" should be --the--.

Column 15:
Line 12, "fast" should be --first--.

Signed and Sealed this

Fourteenth Day of July, 2009

JOHN DOLL
*Acting Director of the United States Patent and Trademark Office*